(12) United States Patent
Cheng et al.

(10) Patent No.: US 10,374,009 B1
(45) Date of Patent: Aug. 6, 2019

(54) TE-FREE ASSEGE CHALCOGENIDES FOR SELECTOR DEVICES AND MEMORY DEVICES USING SAME

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US); I-Ting Kuo, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/038,072

(22) Filed: Jul. 17, 2018

(51) Int. Cl.
*H01L 27/24* (2006.01)
*H01L 45/00* (2006.01)

(52) U.S. Cl.
CPC ...... *H01L 27/2427* (2013.01); *H01L 27/2481* (2013.01); *H01L 45/065* (2013.01); *H01L 45/126* (2013.01); *H01L 45/1233* (2013.01); *H01L 45/143* (2013.01); *H01L 45/1625* (2013.01); *H01L 45/1641* (2013.01)

(58) Field of Classification Search
CPC .......................... H01L 45/143; H01L 27/2427
See application file for complete search history.

(56) References Cited

U.S. PATENT DOCUMENTS

| | | | |
|---|---|---|---|
| 3,271,591 A | 9/1966 | Ovshinsky | |
| 3,343,034 A | 9/1967 | Ovshinsky | |
| 3,571,669 A | 3/1971 | Fleming | |
| 3,571,670 A | 3/1971 | Ovshinsky | |
| 3,571,671 A | 3/1971 | Ovshinsky | |
| 3,571,672 A | 3/1971 | Ovshinsky | |
| 3,588,638 A | 6/1971 | Fleming et al. | |
| 3,611,063 A | 10/1971 | Neale | |
| 3,619,732 A | 11/1971 | Neale | |
| 3,656,032 A | 4/1972 | Henisch | |
| 3,846,767 A | 11/1974 | Cohen | |
| 3,875,566 A | 4/1975 | Helbers | |
| 3,886,577 A | 5/1975 | Buckley | |
| 3,980,505 A | 9/1976 | Buckley | |
| 5,177,567 A | 1/1993 | Klersy et al. | |
| 6,579,760 B1 | 6/2003 | Lung | |
| 6,800,504 B2 | 10/2004 | Li et al. | |
| 6,967,344 B2 | 11/2005 | Ovshinsky et al. | |
| 6,995,390 B2 | 2/2006 | Tsukui | |
| 7,483,293 B2 | 1/2009 | Pinnow et al. | |

(Continued)

FOREIGN PATENT DOCUMENTS

CN 1568494 A 1/2005

OTHER PUBLICATIONS

Ohyanagi et al., "Special Electrical Characteristics of Superlattice Phase Change Memory," ECS Trans., vol. 58, Issue 5, Oct. 31, 2013, pp. 135-158.

(Continued)

*Primary Examiner* — Allison Bernstein
(74) *Attorney, Agent, or Firm* — Haynes Beffel & Wolfeld LLP

(57) ABSTRACT

A voltage sensitive switching device has a first electrode, a second electrode, and a switching layer between the first and second electrodes, comprising a tellurium free, low germanium composition of arsenic As, selenium Se and germanium Ge. The switching device is used in 3D cross-point memory.

12 Claims, 14 Drawing Sheets

(56) References Cited

U.S. PATENT DOCUMENTS

| | | | |
|---|---|---|---|
| 7,688,619 | B2 | 3/2010 | Lung et al. |
| 7,902,538 | B2 | 3/2011 | Lung |
| 7,903,457 | B2 | 3/2011 | Lung |
| 7,929,340 | B2 | 4/2011 | Lung et al. |
| 8,148,707 | B2 * | 4/2012 | Ovshinsky ............ C01B 19/002 257/2 |
| 8,178,387 | B2 | 5/2012 | Cheng et al. |
| 8,315,088 | B2 | 11/2012 | Lung |
| 8,324,605 | B2 | 12/2012 | Lung et al. |
| 8,344,348 | B2 * | 1/2013 | Wicker ................... H01L 45/04 257/2 |
| 8,363,463 | B2 | 1/2013 | Shih et al. |
| 8,426,242 | B2 | 4/2013 | Cheng et al. |
| 8,467,236 | B2 | 6/2013 | Campbell |
| 8,772,747 | B2 | 7/2014 | Cheng et al. |
| 8,916,414 | B2 | 12/2014 | Cheng et al. |
| 8,932,901 | B2 | 1/2015 | Cheng |
| 8,946,666 | B2 | 2/2015 | Cheng et al. |
| 9,177,640 | B2 | 11/2015 | Shintani et al. |
| 9,214,229 | B2 | 12/2015 | Cheng et al. |
| 9,336,879 | B2 | 5/2016 | Lung et al. |
| 9,917,252 | B2 | 3/2018 | Cheng et al. |
| 10,050,196 | B1 | 8/2018 | Cheng et al. |
| 2005/0018098 | A1 | 1/2005 | Sugihara et al. |
| 2011/0049456 | A1 | 3/2011 | Lung et al. |
| 2012/0181499 | A1 | 7/2012 | Chuang et al. |
| 2013/0270505 | A1 | 10/2013 | Dahmani |
| 2016/0276022 | A1 | 9/2016 | Redaelli |
| 2017/0250222 | A1 | 8/2017 | Wu et al. |
| 2017/0263863 | A1 | 9/2017 | Lung et al. |
| 2017/0271581 | A1 * | 9/2017 | Seong ................. H01L 27/2481 |

OTHER PUBLICATIONS

Ovshinsky, "New Transformative Possibilities for Ovonic Devices," E*PCOS2010, European Symposium on Phase Change and Ovonic Science, Milan, Italy Sep. 6-7, 2010, 9 pages.

Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs," Oct. 29-30, 2015, 40 pages.

Shanks, "Ovonic threshold switching characteristics," Journal of Non-Crystalline Solids, vol. 2, Jan. 1970, pp. 504-514.

Shin et al., "The effect of doping Sb on the electronic structure and the device characteristics of Ovonic Threshold Switches based on Ge—Se," Scientific Reports, Nov. 18, 2014, 5 pages.

Simpson et al., "Interfacial phase-change memory," Nature Nanotechnology, vol. 6, Jul. 3, 2011, 502-505.

* cited by examiner

TE-FREE ASSEGE CHALCOGENIDES FOR SELECTOR DEVICES AND MEMORY DEVICES USING SAME

International Business Machines Corporation, a New York corporation, and Macronix International Corporation, Ltd., a Taiwan corporation, are parties to a Joint Research Agreement.

BACKGROUND

Field

The present invention relates to switching devices utilized in integrated circuits, including integrated circuit memory devices.

Description of Related Art

There are many applications for switching devices, such as transistors and diodes, in integrated circuits. One type of switching device is known as the ovonic threshold switch, based on ovonic materials, characterized by a large drop in resistance at a switching threshold voltage, and recovery of a high resistance, blocking state when the voltage falls below a holding threshold.

Switching devices have been used, for example, in various programmable resistance memory devices comprising high density arrays of cells organized in a cross-point architecture. Some cross-point architectures utilize memory cells that include a phase change memory element in series with an ovonic threshold switch, for example. Other architectures are utilized, including a variety of 2-dimensional and 3-dimensional array structures, which can also utilize switching devices to select memory elements in the array. In cross-point arrays, and other high density arrays, access to any small subset of the array for accurate reading or low-power writing requires a strong nonlinearity in the current versus voltage (I-V) characteristics of the switch in the memory cells, so that the current passing through the selected devices greatly exceeds the residual leakage through the unselected devices. This nonlinearity can either be included explicitly, by adding a discrete access device at each cross-point, or implicitly with a memory device which also exhibits a highly nonlinear I-V characteristic Also, ovonic threshold switches have been proposed for a variety of other uses, including so called neuromorphic computing.

One important characteristic of switching devices, particularly in integrated circuits having very large numbers of them, is leakage current, or off-state current. The leakage current is the amount of current flow in a switching device in a sub-threshold state. Also, switching devices should have fast switching speeds, and high endurance.

It is desirable to provide a switching device with relatively high threshold voltages, low leakage current, fast switching speeds and high endurance.

SUMMARY

A voltage sensitive switching device is described comprising a first electrode, a second electrode, and a switching layer between the first and second electrodes, comprising a tellurium free, low germanium composition of arsenic As, selenium Se and germanium Ge.

Materials for a switching layer described herein include a class of compositions of AsSeGe, including As in a range of 15 at % to 46 at %, Se in a range of 27 at % to 60 at % and Ge in a range of 10 at % to 25 at %. In members of this class of compositions, the amounts of As, Se and Ge in a switching layer are combined in amounts and with a thickness of the layer, effective to switch with a threshold voltage Vt>3V, and in some members of this class, with a threshold voltage Vt>4V. Compositions are effective to switch with a threshold voltage, when control circuitry is configured for a threshold voltage satisfying the relation, by applying a voltage to a selected switch so that the voltage on the switching layer in the selected switch is above the threshold, and applying a voltage to an unselected switch so that the voltage on the switching layer in unselected switch is below the threshold during an operation accessing the selected switch.

In members of this class of compositions, the amounts of As, Se and Ge in a switching layer are combined in amounts and with a thickness of the layer, effective to switch with a threshold voltage Vt, with an off-state current less than 1 nA, or in some embodiments, less than 500 pA. Compositions are effective to have an off-state current specified according to the relation, when control circuitry is configured to apply a voltage to a selected switch so that the voltage on the switching layer in the select selected switch is above the threshold voltage Vt, and applying a voltage to an unselected switch so that the voltage on the switching layer in an unselected switch is below the threshold voltage Vt, and the current in the unselected switch is less than the specified off-state current, i.e, less than 1 nA or less than 500 pA, during an operation accessing the selected switch.

Compositions in this class can have As, Se and Ge in amounts effective to have a very low off-state leakage current IOFF, such as less than one nanoAmpere (<1 nA) of even less than 500 picoAmpere (<500 pA), a relatively high threshold voltage, such as greater than 3 Volts (>3V) or greater than 4 Volts (>4V), for switching layers having thicknesses less than 50 nanometers (nm), including in a range of 15 nm to 45 nm, inclusive.

A memory device is described that includes a first electrode, a second electrode, a memory element in contact with the first electrode, and a switching layer such as described above, in series with the memory element between the first and second electrodes. The memory device can include a barrier layer between the memory element and the switching layer. The memory device can be configured as a 3D cross-point memory on an integrated circuit device, having very high density.

Also the switching device can be utilized in a variety of other kinds of devices.

Other aspects and advantages of the present invention can be seen on review of the drawings, the detailed description and the claims, which follow.

DETAILED DESCRIPTION

A detailed description of embodiments of the present invention is provided with reference to the FIGS. 1-21.

Figure 1:
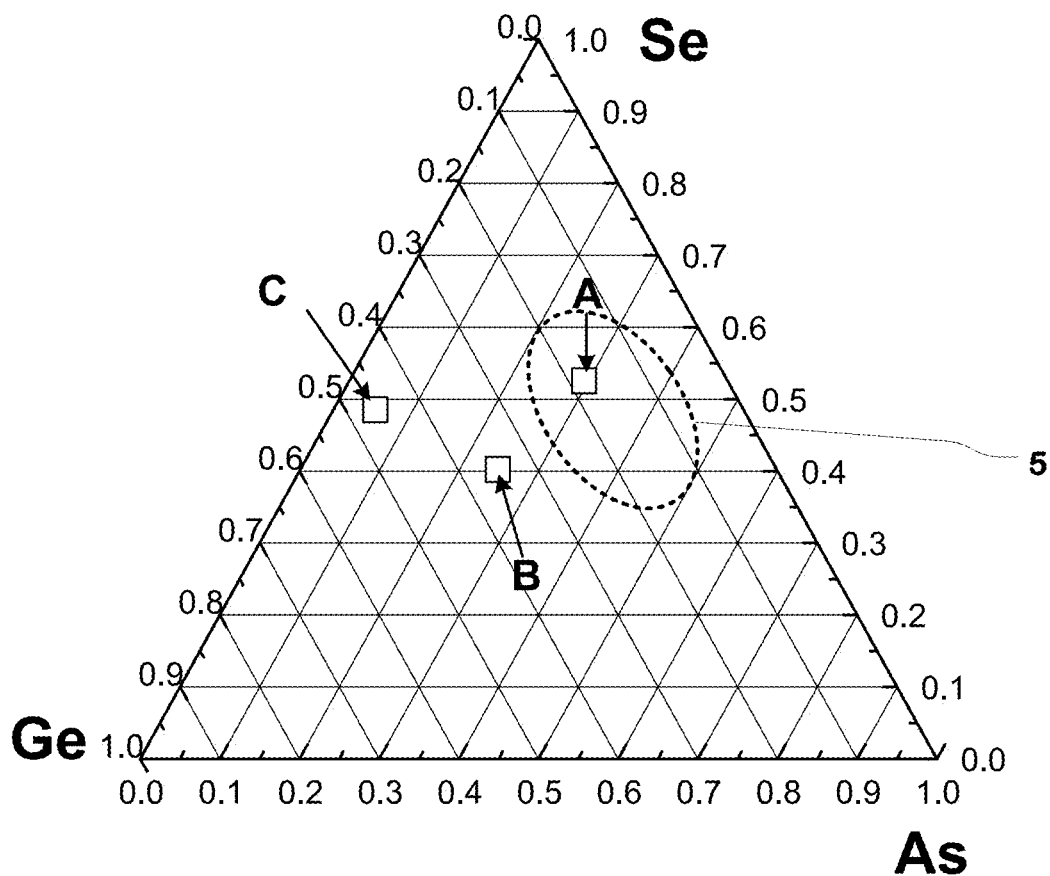
FIG. 1 is a ternary composition diagram illustrating a class of materials described herein.

FIG. 1 is a ternary composition diagram for materials As, Se and Ge, illustrating a region 5 that represents a class of Te-free, low Ge materials having a high threshold voltage, a low off state current, and good switching endurance.

In FIG. 1, materials A, B and C are plotted, which have compositions as shown in the following table.

|   | As (at. %) | Se (at. %) | Ge (at. %) |
|---|---|---|---|
| A | 25.2 | 54.3 | 20.5 |
| B | 24.8 | 40.2 | 35 |
| C | 5.3 | 48.5 | 46.2 |

Materials A, B and C have been tested, demonstrating a surprising and unexpectedly good performance as a switching layer for material A, which is representative of the class of Te-free, low-Ge AsSeGe materials described herein, as compared to materials B and C. For example, a switching device having a switching layer of Material B was found to have a threshold voltage Vt of about 2.7 V, and an off-state current of about 26 nA. A switching device having a switching layer of material C was found to have a threshold voltage Vt of about 2.8 V, and an off-state current of about 166 nA. In contrast, a switching device having a switching layer of material A was found to have a higher threshold voltage Vt, of about 3 V, and an off-state current of about 338 pA. In addition, as discussed below, the switching endurance of switching devices of material A is found significantly superior. Accordingly, a new class of low-Ge AsSeGe materials is described for use as an ovonic threshold switch in memory devices or other environments. Embodiments of the materials can be Te-free. In some embodiments, additives such as silicon, carbon and nitrogen can be included in the low-Ge AsSeGe materials used for a switching layer.

The switching material described herein can be characterized as falling approximately in the region 5 of the ternary composition diagram shown in FIG. 1. Materials generally in this region 5 include a class of compositions of AsSeGe, including As in a range of 15 at % to 46 at %, Se in a range of 27 at % to 60 at % and Ge in a range of 10 at % to 25 at %. The relative concentrations of the elements for a particular member of this class of compositions can be chosen so that they are effective to achieve one or more of the characteristics including the high threshold voltage, the low-off state current, the fast switching and the high endurance demonstrated by the testing described herein.

Figure 2:
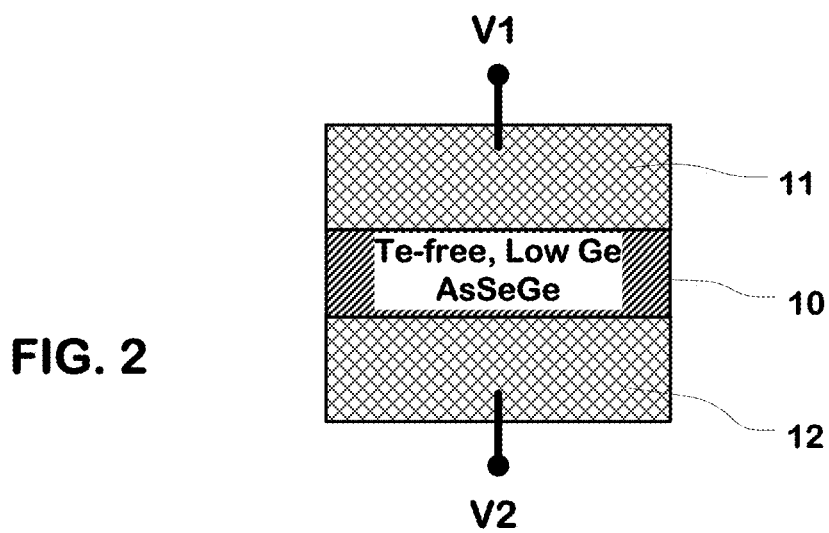
FIG. 2 is a simplified cross-section of a switching device including a layer of a composition comprising Te-free, low Ge AsSeGe.

FIG. 2 is a simplified diagram of a switching device that includes a switching layer 10 of a Te-free, low-Ge AsSeGe material as described herein. The switching device includes a first electrode 11 and a second electrode 12, with the switching layer 10 in series between the first electrode and the second electrode. A voltage V1 can be applied to the first electrode 11, and a voltage V2 can be applied to the second electrode 12.

Figure 3:
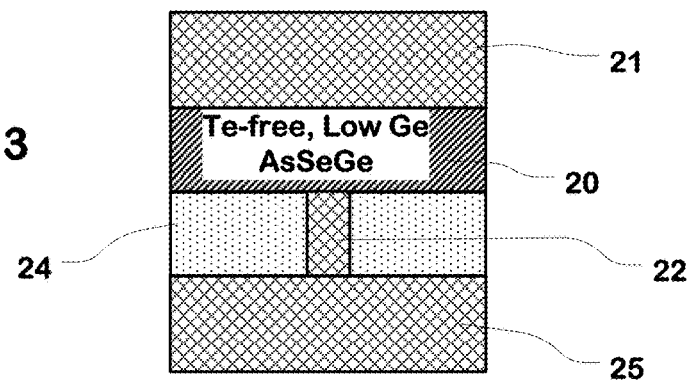
FIG. 3 is a simplified cross-section of a switching device including a composition as described herein in a "mushroom cell" configuration.

FIG. 3 is a simplified diagram of a switching device in a "mushroom cell" configuration, including a switching layer 20 which includes a first electrode 21 and a second electrode 22, with the switching layer 20 in series between the first electrode 21 and the second electrode 22. The second electrode 22 in this example is coupled through a dielectric layer 24 to a conductor 25 that can be configured for connection to a driver or other voltage source used for operating the switching device. In the "mushroom cell" configuration, the second electrode 22 has a contact area with the switching layer 20 that is much smaller than the corresponding contact area of the first electrode 21 with the switching layer 20. The smaller contact area serves to concentrate the current through the switching layer in a smaller region, which can enable lower current operation of the switching element.

For the switching devices of FIG. 2 and FIG. 3, when the voltage (V1-V2) across the first electrode 11, 21 and the second electrode 12, 22 exceeds a threshold voltage of the switching layer, then the switching device is turned on. When the voltage across the first electrode 11, 21 and the second electrode 12, 22 is below a holding threshold voltage of the switching layer, and the switching device returns to a high impedance, off state. The switching devices shown in FIGS. 2 and 3 can have a highly nonlinear current versus voltage characteristic, making them suitable for use as a switching element in a high density memory device, and in other settings.

Figure 4:
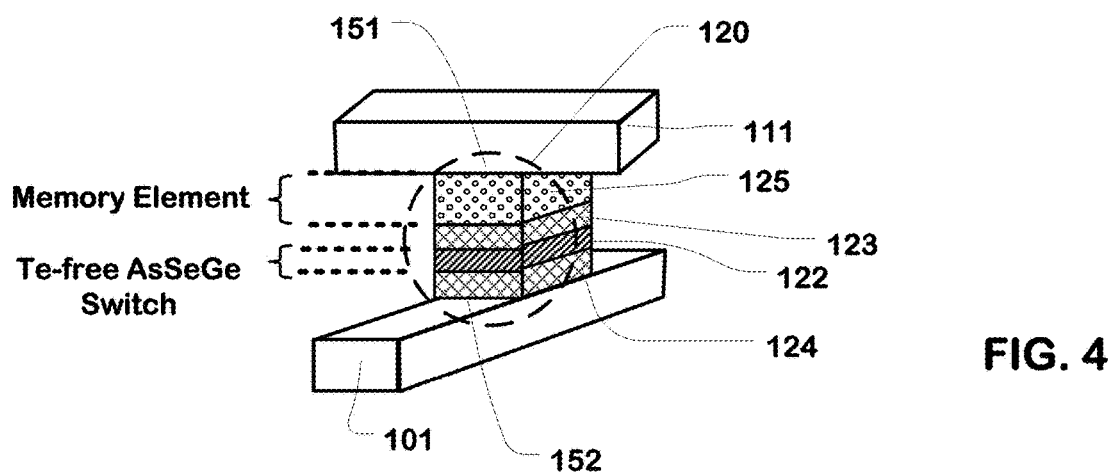
FIG. 4 is a simplified 3D perspective of a memory cell in a cross-point memory device including a switching device as described herein.

FIG. 4 illustrates an example memory cell 120 disposed in the cross-point of a first access line 111 and a second access line 101. Memory cell 120 is in contact with the first access line (bit line) 111, and in contact with the second access line (word line) 101. Memory cell 120 includes a memory element 125 proximal to the first access line 111, contacting the first access line 111 at surface 151 in this example. The memory cell 120 includes a switching layer 122 proximal to the second access line 101. A first barrier layer 123 is disposed between the switching layer 122 and the memory element 125. A second barrier layer 124, acting as a switch electrode, is disposed in this example between the switching layer 122 and the surface 152 of the second access line 101. The switching layer 122, for example, can include a Te-free, low Ge AsSeGe material as described above.

The first barrier layer 123 can provide adhesion and diffusion barrier functions between the switching layer 122 and the memory element 125. The first barrier layer 123 may have a layer of conductive material with a thickness of about 5 to about 50 nm, preferably about 20 nm. Example materials for the first barrier layer 123 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, first barrier layer 123 can comprise materials such as carbon, doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

The second barrier layer 124 can provide adhesion and diffusion barrier functions between the switching layer 122 and the second access line 101, and act as an electrode. The second barrier layer 124 can have the same material as the first barrier layer 123, such as TiN, and act as an electrode on the switching layer 122. In some embodiments, the second barrier layer 124 can have a different material than the first barrier layer 123. In some embodiments, the second barrier layer 124 can be eliminated such that the switching layer 122 is in contact with the second access line 101 which acts as an electrode on the switching layer 122.

The memory element 125 can comprise a layer of programmable resistance material. In one example, the memory element 125 comprises a phase change memory material. In some embodiments, other programmable resistance memory elements can be implemented, such as metal-oxide resistive memories, magnetic resistive memories and conducting-bridge resistive memories, or other types of memory devices.

A phase change memory material can be, for example, a layer of chalcogenide having a thickness of about 10 nm to about 50 nm, preferably about 30 nm. Chalcogenides utilized as phase change memory elements are capable of being switched between a relatively low resistance state, amorphous phase, and a relatively high resistance state, crystalline phase, by application of energy such as heat or electrical current. In some embodiments, multilevel cells having multiple resistance states can be used.

Embodiments of materials for the memory element 125 can include chalcogenide-based materials and other materials. A chalcogenide-based material suitable for use as a memory element can contain one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example dielectric doped $Ge_2Sb_2Te_5$, $GeSb_2Te_4$ and $GeSb_4Te_7$. In some embodiments, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials that may be useful are disclosed in Ovshinsky, U.S. Pat. No. 5,687,112 at columns 11-13, which examples are incorporated by reference.

The memory element 125 can comprise a layer of chalcogenide alloy with additives to modify conductivity, transition temperature, melting temperature, and other properties. Representative additives can include nitrogen (N), silicon (Si), oxygen (O), silicon dioxide ($SiO_x$), silicon nitride (SiN), copper (Cu), silver (Ag), gold (Au), aluminum (Al), aluminum oxide ($Al_2O_3$), tantalum (Ta), tantalum oxide ($TaO_x$), tantalum nitride (TaN), titanium (Ti), and titanium oxide ($TiO_x$).

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the memory element 125. Likewise, the material selected for the first access lines is preferably selected for compatibility with the second barrier layer 124.

In another embodiment, a bottom electrode like that shown in FIG. 3, having a smaller contact surface than the surface of the memory element, is interposed between the memory element 125 and the switching layer 122 or between the memory element 125 and the first access line 111. As such, an increased current density at the contact in the memory element can be achieved. Such bottom electrode may comprise titanium nitride (TiN), tantalum nitride (TaN), titanium silicon nitride (TiSiN), titanium aluminum nitride (TiAlN), tantalum aluminum nitride (TaAlN), and tungsten nitride (WN). The bottom electrode in contact with the active region of the chalcogenide alloy is sometimes referred to as a "heater," reflecting embodiments in which the electrode can have relatively high resistance, and contributes to the Joule heating in the active region of the chalcogenide alloy.

Figure 5:
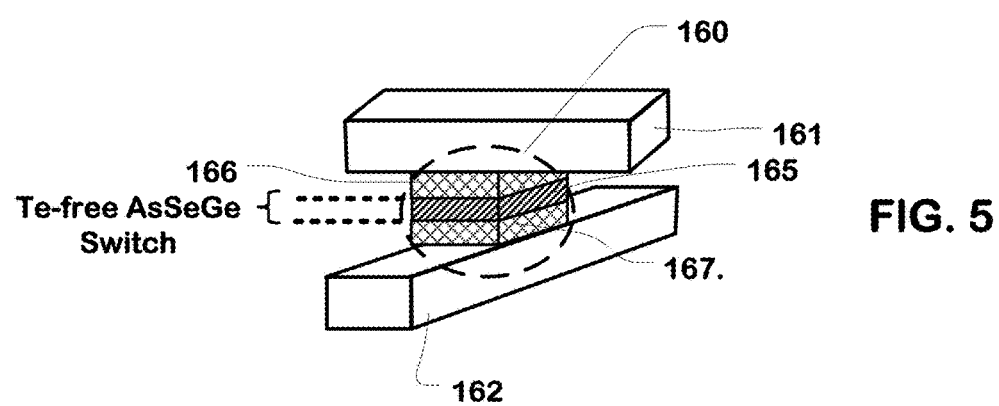
FIG. 5 is a simplified 3D perspective of a switching device in a cross-point configuration as described herein.

FIG. 5 illustrates an example switching cell 160 disposed in the cross-point of a first access line 161, and a second access line 162. The switching cell 160 is disposed in series between the first access line 161 and the second access line 162. The switching cell 160 includes a switching layer 165, disposed between the first barrier layer 166 and a second barrier layer 167. The switching layer 165 can comprise a Te-free, low-Ge AsSeGe material as described herein. Representative materials of the barrier layers 166, 167 can be the same as those discussed above.

Figure 6:
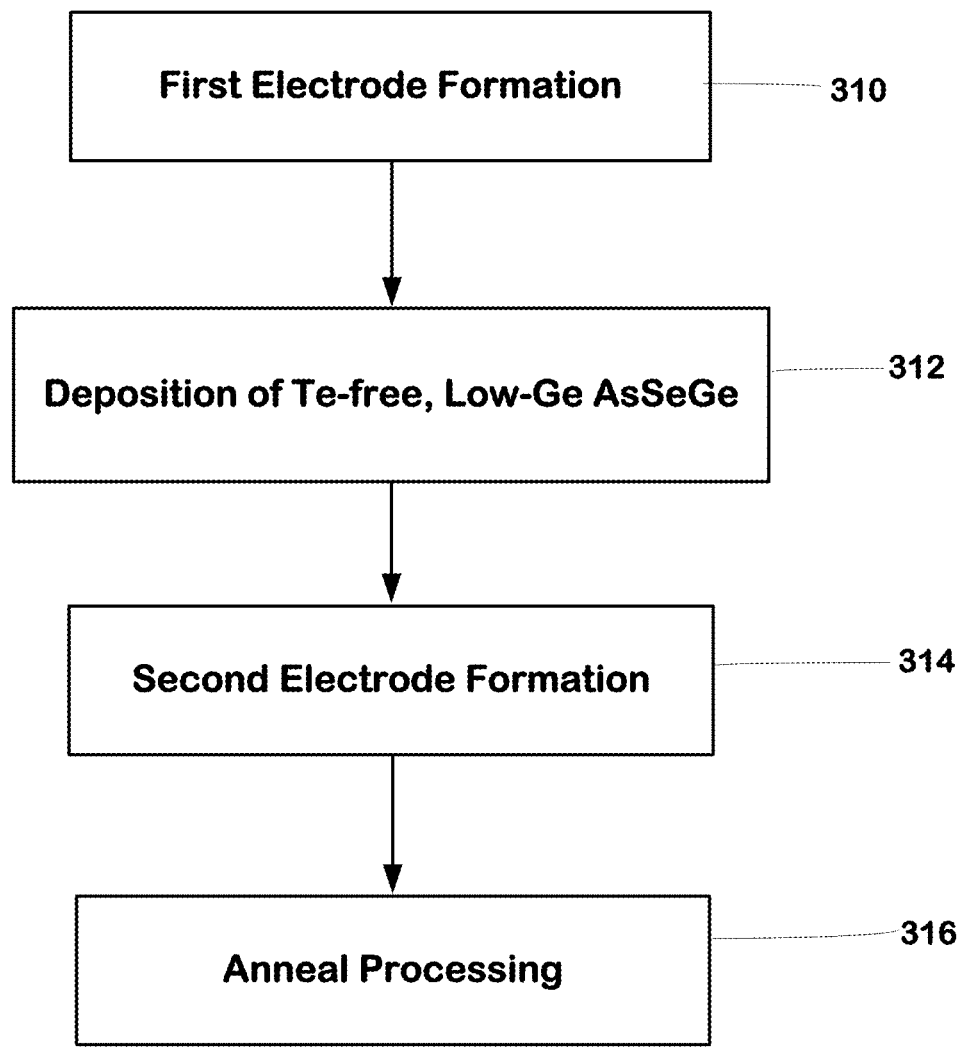
FIG. 6 is a simplified flowchart for manufacturing a switching device as described herein.

FIG. 6 is a simplified flow chart of a manufacturing process for manufacturing a switching device like that shown in FIG. 3. At step 310, the first electrode is formed on a substrate, and may extend through the dielectric layer to underlying circuits, or may be a patterned access line such as in a 3D cross-point array. As an example, the first electrode can comprise TiN and the dielectric layer can comprises SiN. The underlying circuitry or patterned access lines can be formed by standard processes as known in the art, and the configuration of elements of the circuitry depends upon the configuration in which the switching devices described herein are implemented. Generally, the circuitry may include access devices such as transistors, diodes, ovonic threshold switches, bit lines, word lines and source lines, conductive plugs, and doped regions within a semiconductor substrate.

The first electrode and the dielectric layer can be formed, for example, using methods, materials, and processes as disclosed in U.S. Pat. No. 8,138,028 entitled "Method for Manufacturing a Phase Change Memory Device with Pillar Bottom Electrode", which is incorporated by reference herein.

Alternatively, the switching devices can be organized in a cross-point architecture, such as described in U.S. Pat. No. 6,579,760, entitled SELF-ALIGNED, PROGRAMMABLE PHASE CHANGE MEMORY, issued 17 Jun. 2003, which is incorporated by reference herein. The first electrode can be the access lines, such as word lines and/or bit lines. In such architecture, the access devices are arranged between the switching devices and the access lines.

At step 312, a switching layer including a Te-free, low Ge AsSeGe material is formed in a sputtering system.

At step 314, a second electrode is formed. The second electrode can be formed by deposition and patterned etch, for example, of a conductive material.

Figure 21:
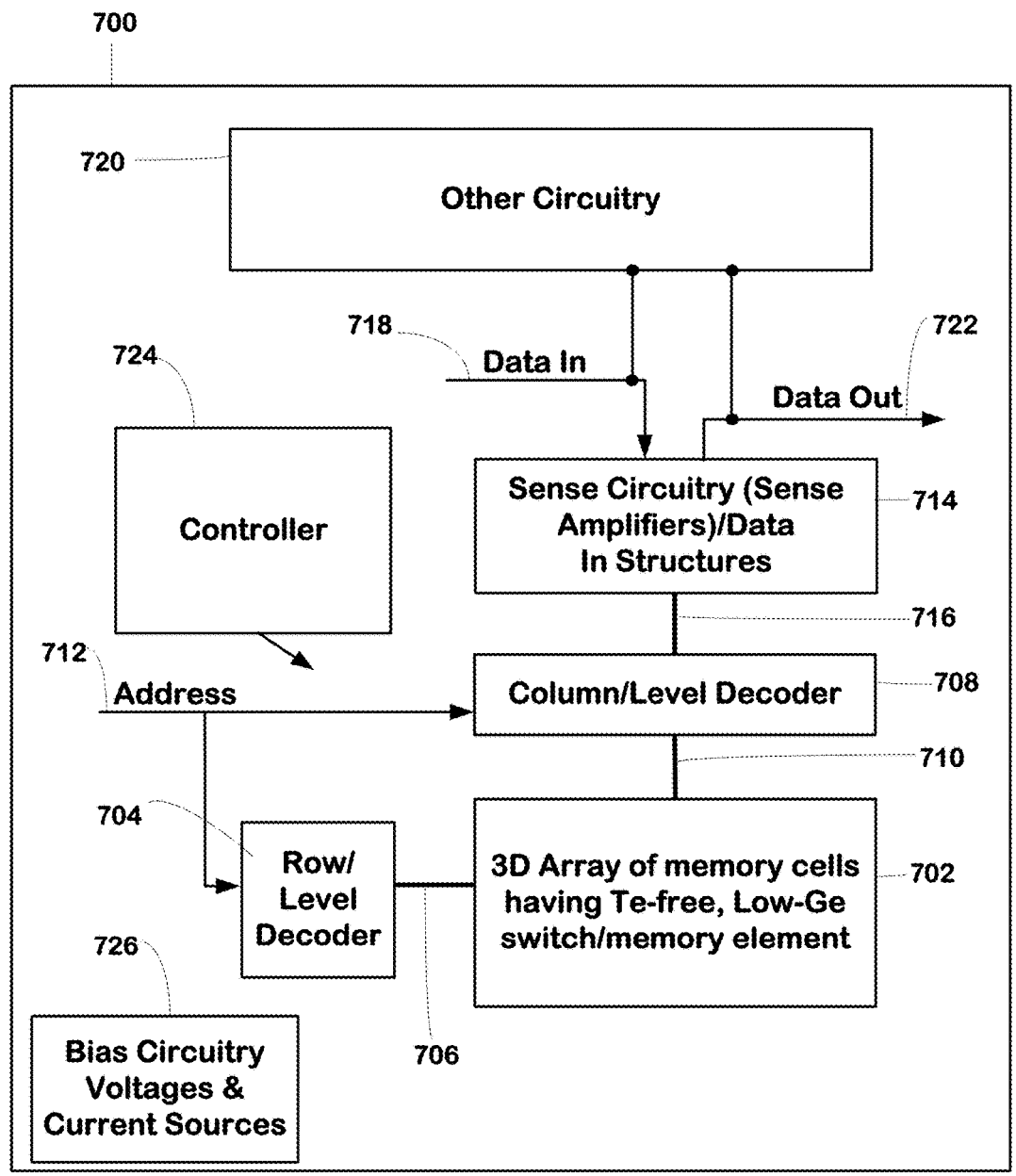
FIG. 21 is a simplified block diagram of an integrated circuit memory device comprising a 3D memory utilizing switching devices as described herein.

At step 316, anneal processing is performed to stabilize the characteristics of the switching devices formed. This annealing process can be combined with back-end-of-line (BEOL) processing. The BEOL process is to complete the semiconductor process steps of the chip, resulting in the structure illustrated in FIG. 21. The BEOL processes can be standard processes as known in the art, and the processes performed depend upon the configuration of the chip in which the switching device is implemented. Generally, the structures formed by BEOL processes may include contacts, inter-layer dielectrics and various metal layers for interconnections on the chip, including circuitry to couple the switching device to peripheral circuitry. As a result of these processes, control circuits and biasing circuits as shown in FIG. 21 are formed on the device.

Figure 7:
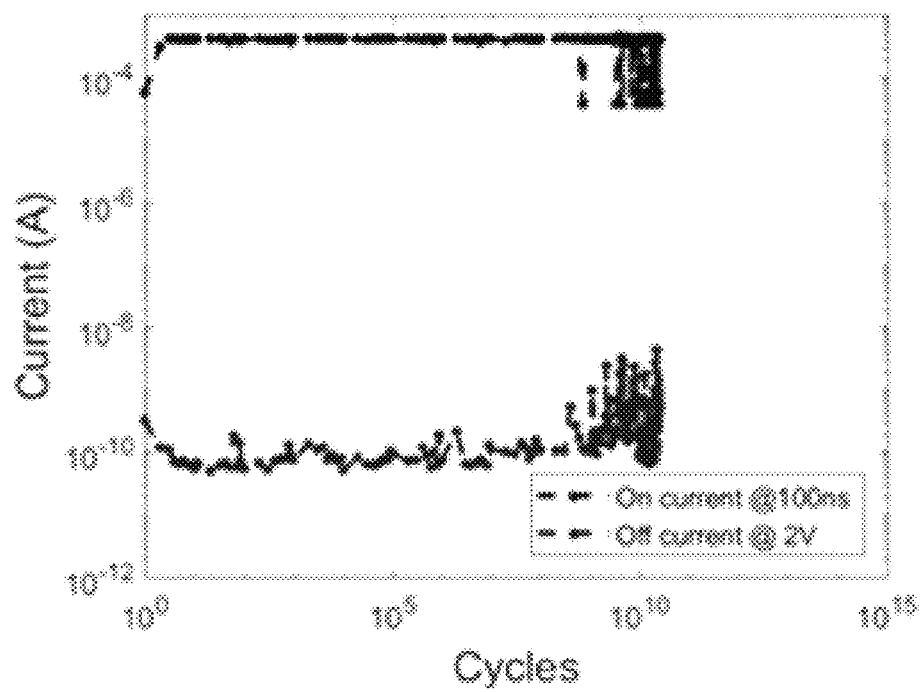
FIGS. 7-9 are graphs showing results of endurance testing for the materials A, B and C shown in FIG. 1, having thicknesses of 30 nm.
Figure 8:
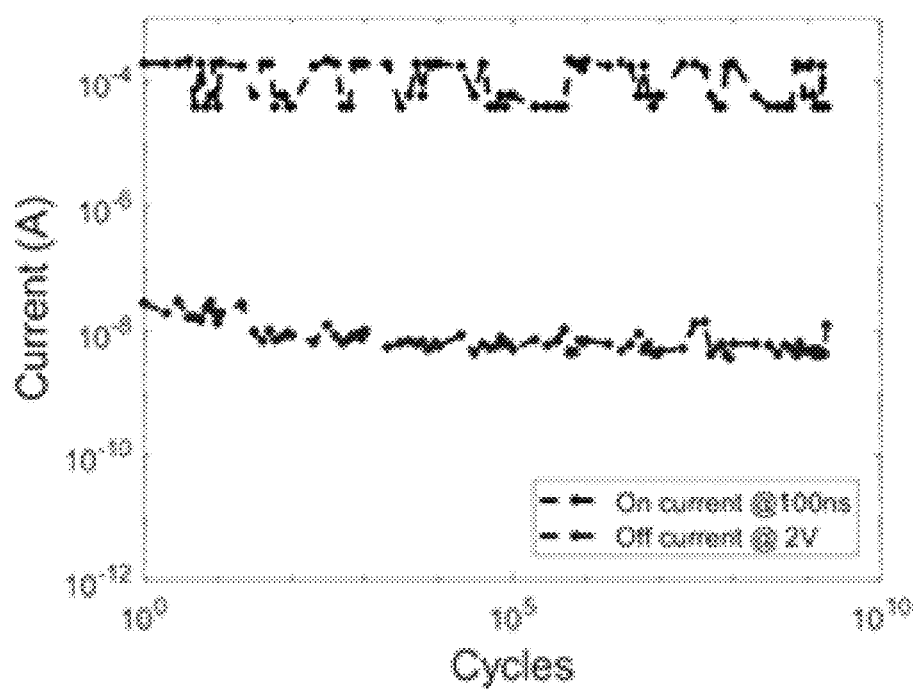
Figure 9:
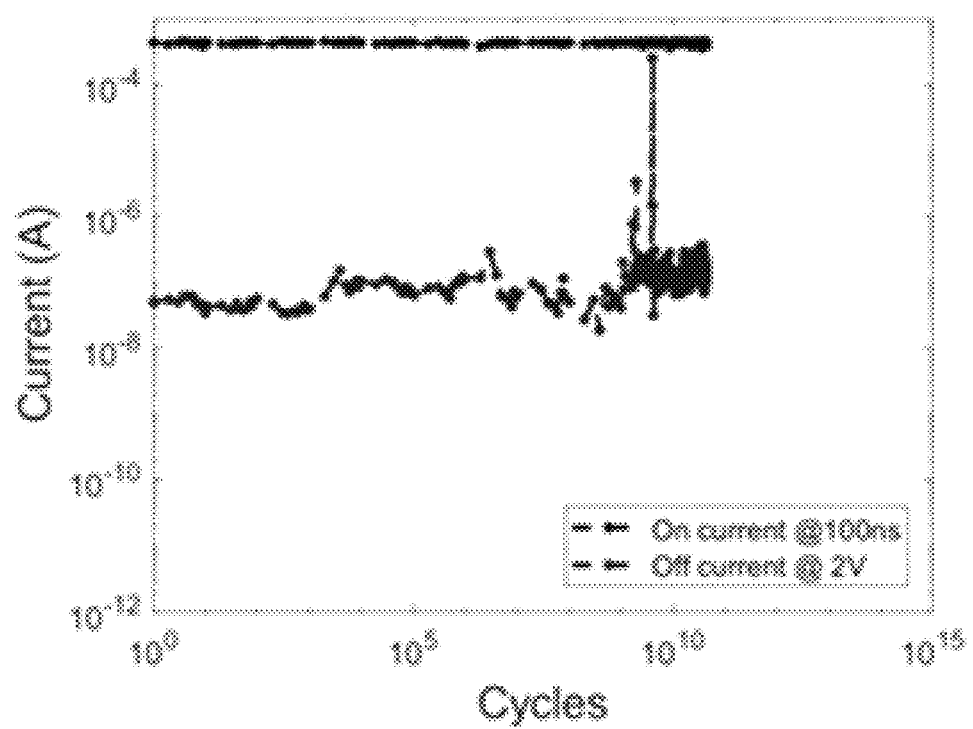

FIGS. 7, 8 and 9 show cycling endurance plots for materials A, B and C, respectively, using a 30 nm thickness of the material for the switching layer. As can be seen, material A demonstrates a very low off-state current and good endurance. Material B, which has an elevated germanium content of about 35 at % relative to the Te-free, low Ge class of materials, while having an improved off-state current relative to Material C, has an unstable threshold voltage. Material C, has a relatively high off-state current, and fails at the latter parts of the endurance testing. Thus, it is demonstrated that materials such as Material A falling approximately in the region 5 can be selected that are effective to establish unexpectedly high endurance and high switching speed, unexpectedly high threshold voltage and unexpectedly low off-state current.

Figure 10:
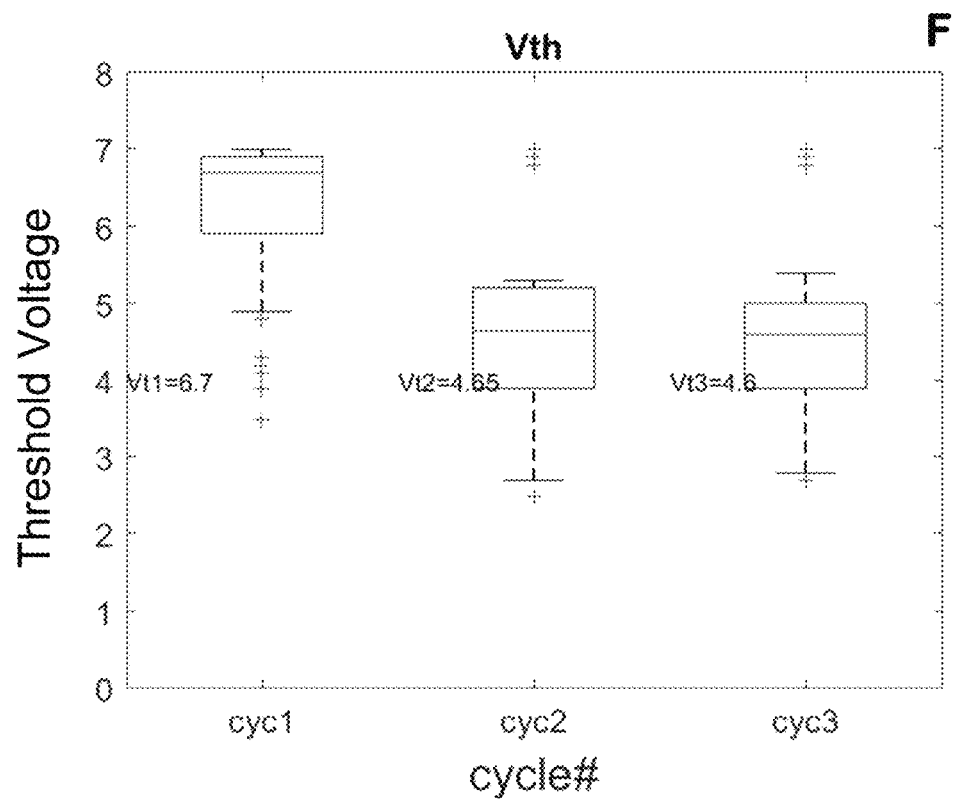
FIG. 10 is a box plot for threshold voltage versus cycle number for a switch comprising a switching layer 45 nm thick of material A.
Figure 11:
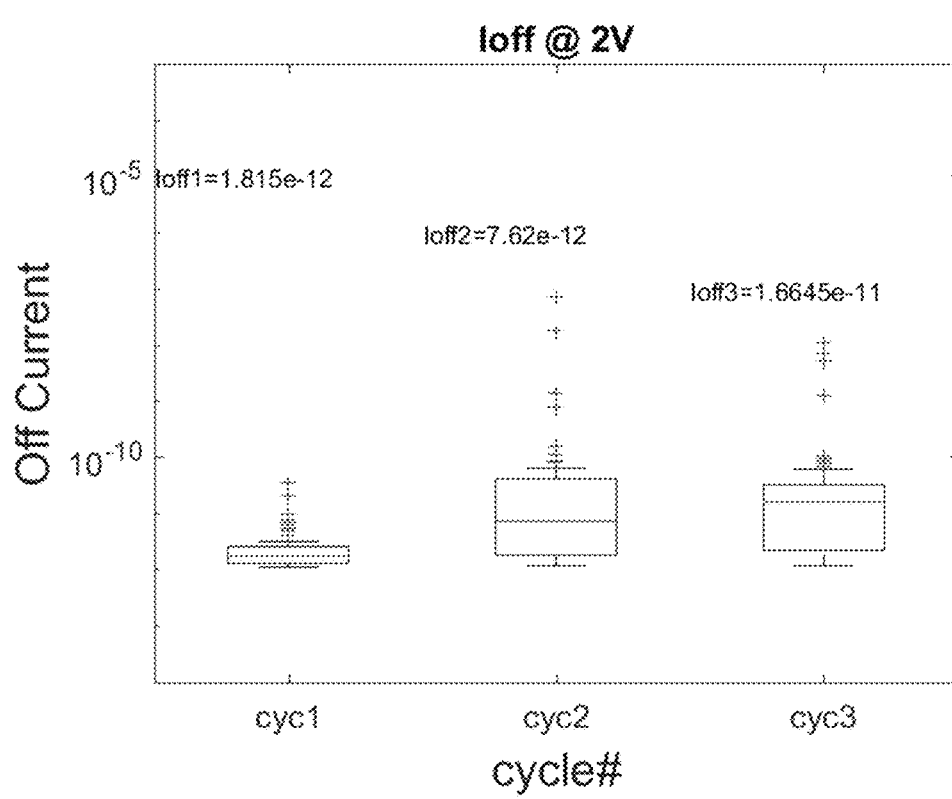
FIG. 11 is a box plot for off-state current versus cycle number for a switch comprising a switching layer 45 nm thick of material A.

FIGS. 10 and 11 are box plots showing testing results for a set of 66 test chips for threshold voltage versus cycle number, and off-state current versus cycle number for Material A having a thickness of 45 nm. In these box plots, the first cycle acts as a forming pulse for the memory cell. Cycles 2 and 3 are representative of normal operation of the memory cells. As seen in FIG. 10, for cycle 2, the threshold voltage median is about 4.65 V. The third quartile value is about 4 V in the first quartile value is about 5 V. For cycle 3, the threshold voltage median is about 4.6 V, the third quartile value is about 4 V, and the first quartile value is about 4.8 V. The bars on the vertical lines through the boxes represent the edges of the distributions. Tail bits in the testing are represented by the "+" symbols.

As seen in FIG. 11, for cycle 2, the median off-state current with two volts applied across switching layer is about 7.6e-12. For cycle 3, the median off-state current is about 1.66e-11 with a thickness of 45 nm.

Thus, the threshold voltage is quite high, greater than 4 V, and the off-state current is quite low, less than 500 pA, for a switching layer using Material A at a thickness of 45 nm.

Figure 12:
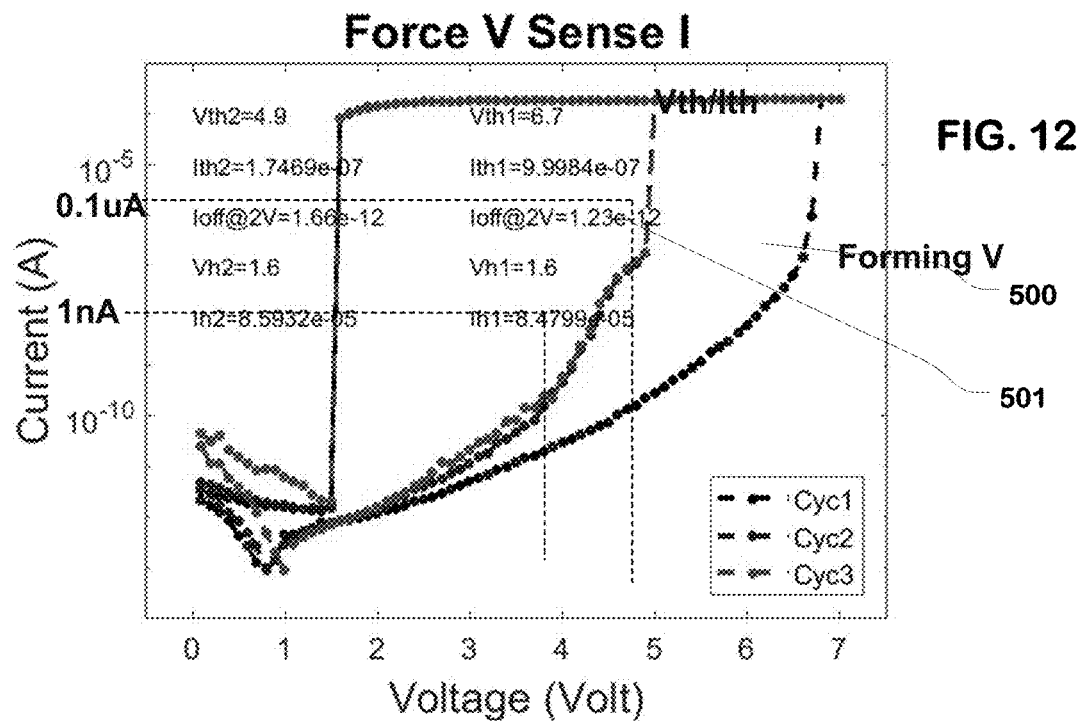
FIG. 12 is a current versus voltage plot for a switch comprising a switching layer 45 nm thick of material A.

FIG. 12 is a current versus voltage plot for three cycles of a representative cell using material A over a 7 I-V sweep. In the first cycle (trace 500) the behavior of the forming pulse is graphed. In cycles 2 and 3, the plots largely overlap (traces in region 501). As can be seen, the threshold is greater than 4 V. At 4 V, the current through the switching layer remains quite low at about 1 nA. At 5 V, the current through the switching layer is increased to about 0.1 µA. The off-state current with a voltage of 2 V is about 1.66e-12. The holding threshold Vh for cycles 2 and 3 is about 1.6 V. The switch therefore is operable with a switching voltage less than 1 V for the off state and a switching voltage greater than 5 V for the on state, allowing a significant operating margin.

Figure 13:
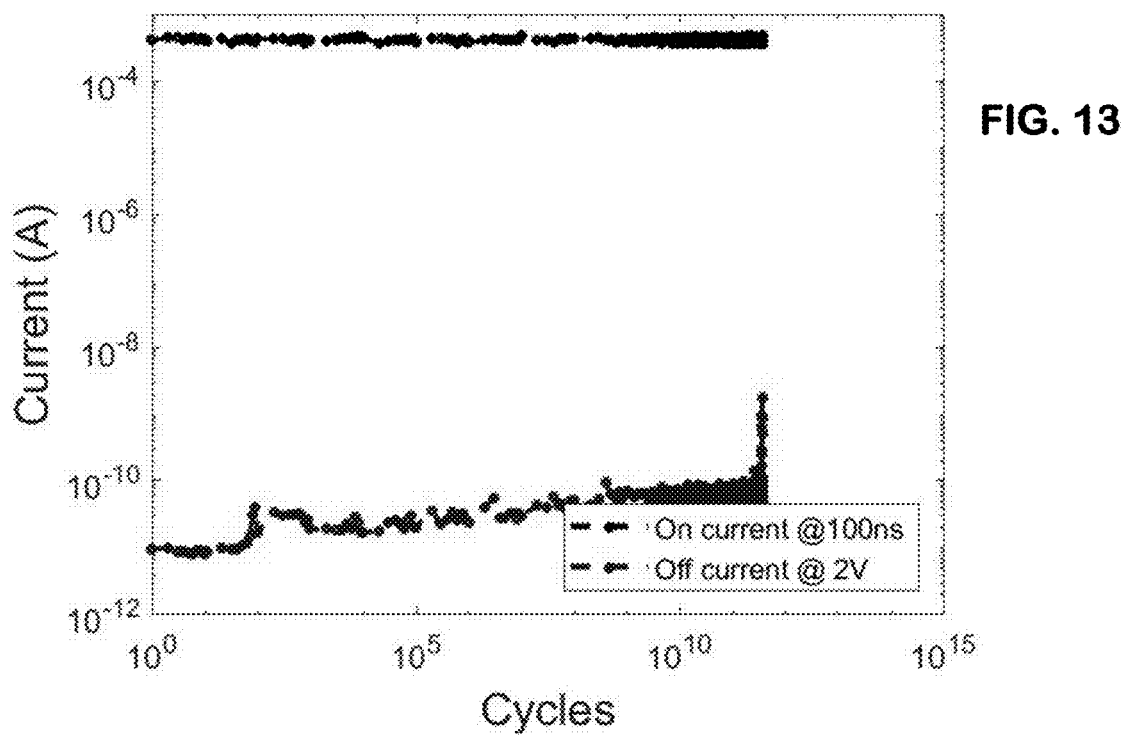
FIG. 13 is a graph showing results of endurance testing for a switching layer 45 nm thick of material A.

FIG. 13 illustrates the results of endurance testing for a 45 nm device comprising material A. As seen, the endurance is quite good, with low off-state current.

Figure 14:
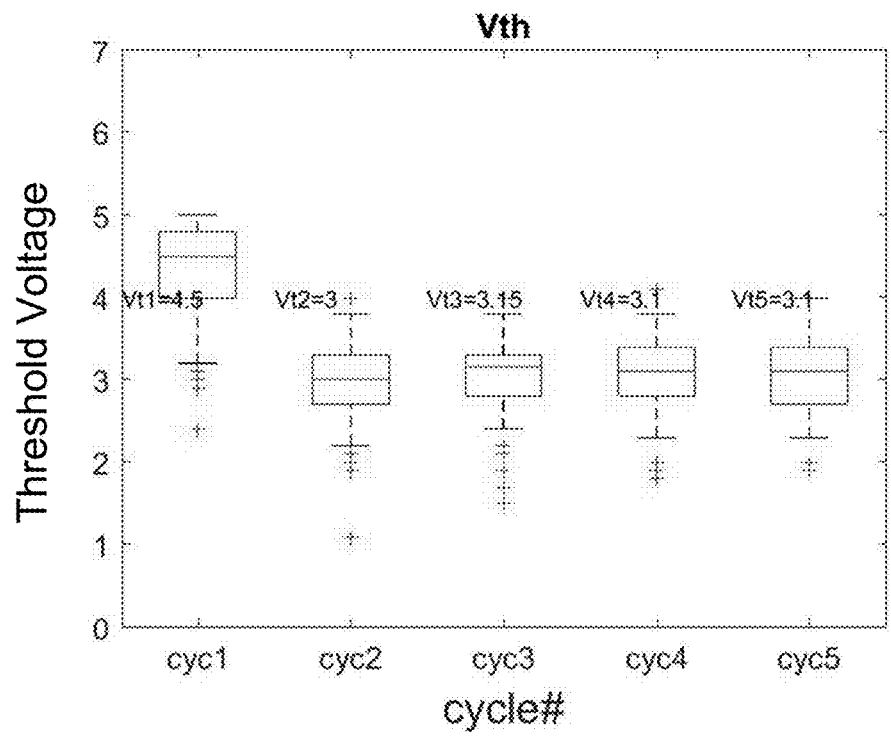
FIG. 14 is a box plot for threshold voltage versus cycle number for a switch comprising a switching layer 30 nm thick of material A.
Figure 15:
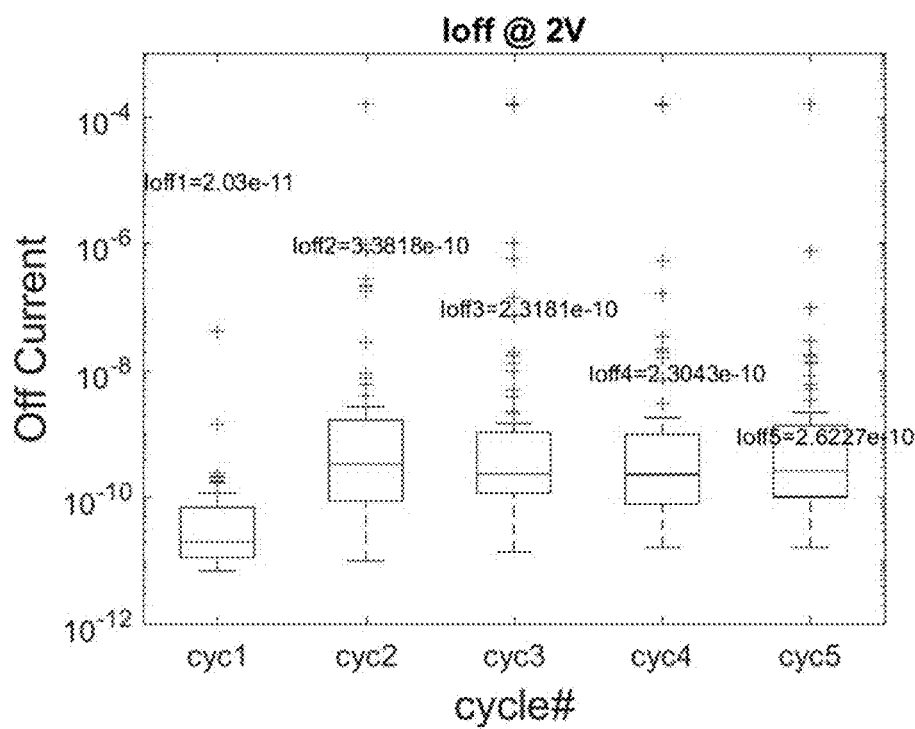
FIG. 15 is a box plot for off-state current versus cycle number for a switch comprising a switching layer 30 nm thick of material A.

FIGS. 14 and 15 illustrate threshold voltage versus cycle number, and off-state current versus cycle number, plots for testing of a group of devices made using Material A at 30 nm thickness. In cycles after the forming pulse in cycle 1, FIG. 14 illustrates, the median threshold for the distribution of cells is about greater than or equal to 3 V. The first quartile is about 3.2 V, and the third quartile is greater than 2.8 V. FIG. 15 illustrates that the median off-state current after cycle 1 is in a range of 2.6e-10 to 3.38e-10A, with first quartile values on the order of 1 nA, and third quartile values on the order of 1e-10A.

This shows that the threshold voltage and off-state current are dependent on the thickness of the switching layer of the Te-free, low Ge AsSeGe class of materials described herein. Thus, these values can be tuned by changing the thickness of the switching layer. A 30 nm thick switching layer of Material A is demonstrated at a threshold voltage of about 3 V, and an off-state current of about 338 pA or less.

A beneficial range of thicknesses for the Te-free, low Ge AsSeGe class of materials described herein is 15 nm to 45 nm for use as a switching element, as can be utilized in a cross-point memory array.

Figure 16:
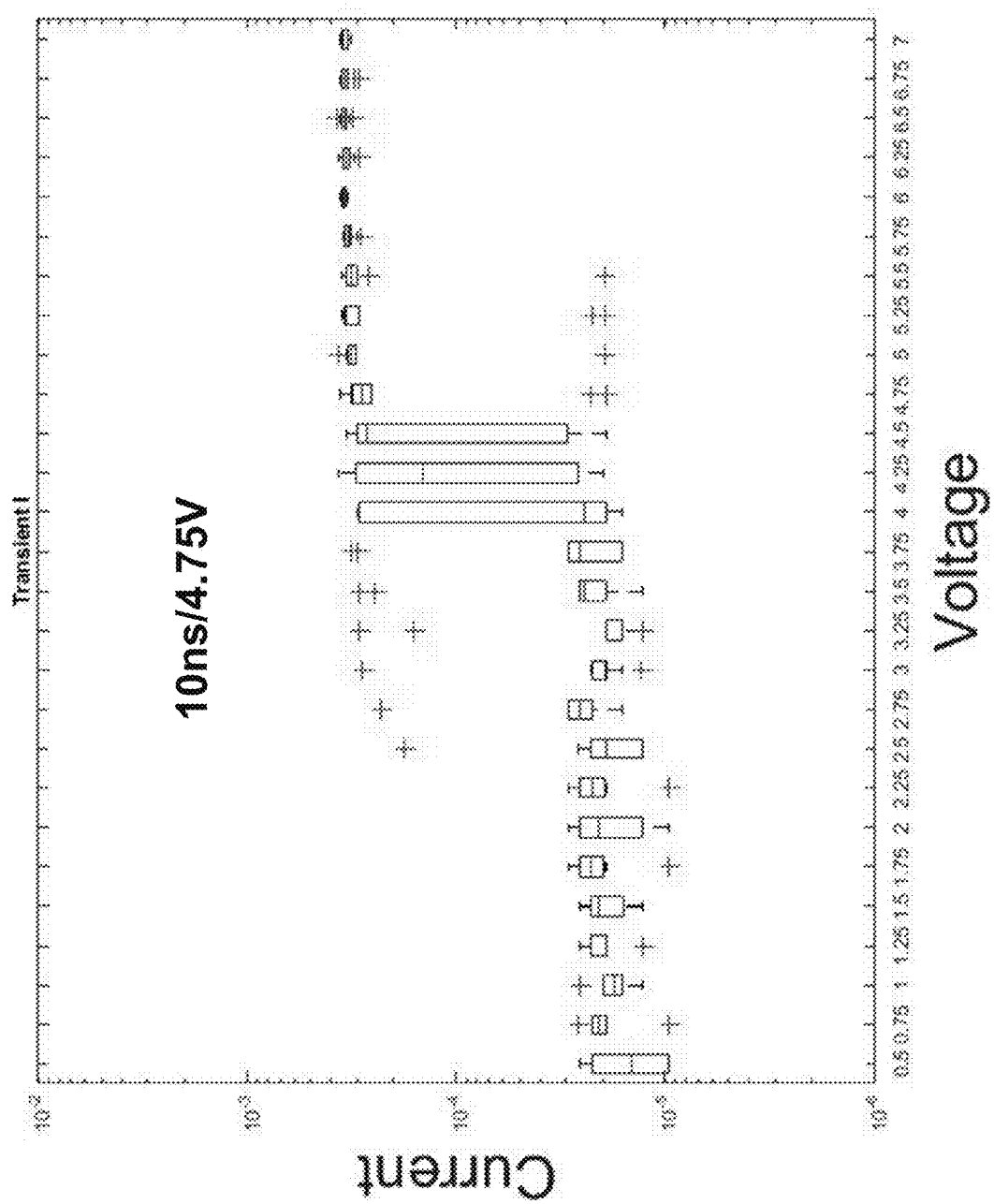
FIGS. 16-20 are box plots showing AC threshold voltage test results for a switching layer 30 nm thick of material A.
Figure 17:
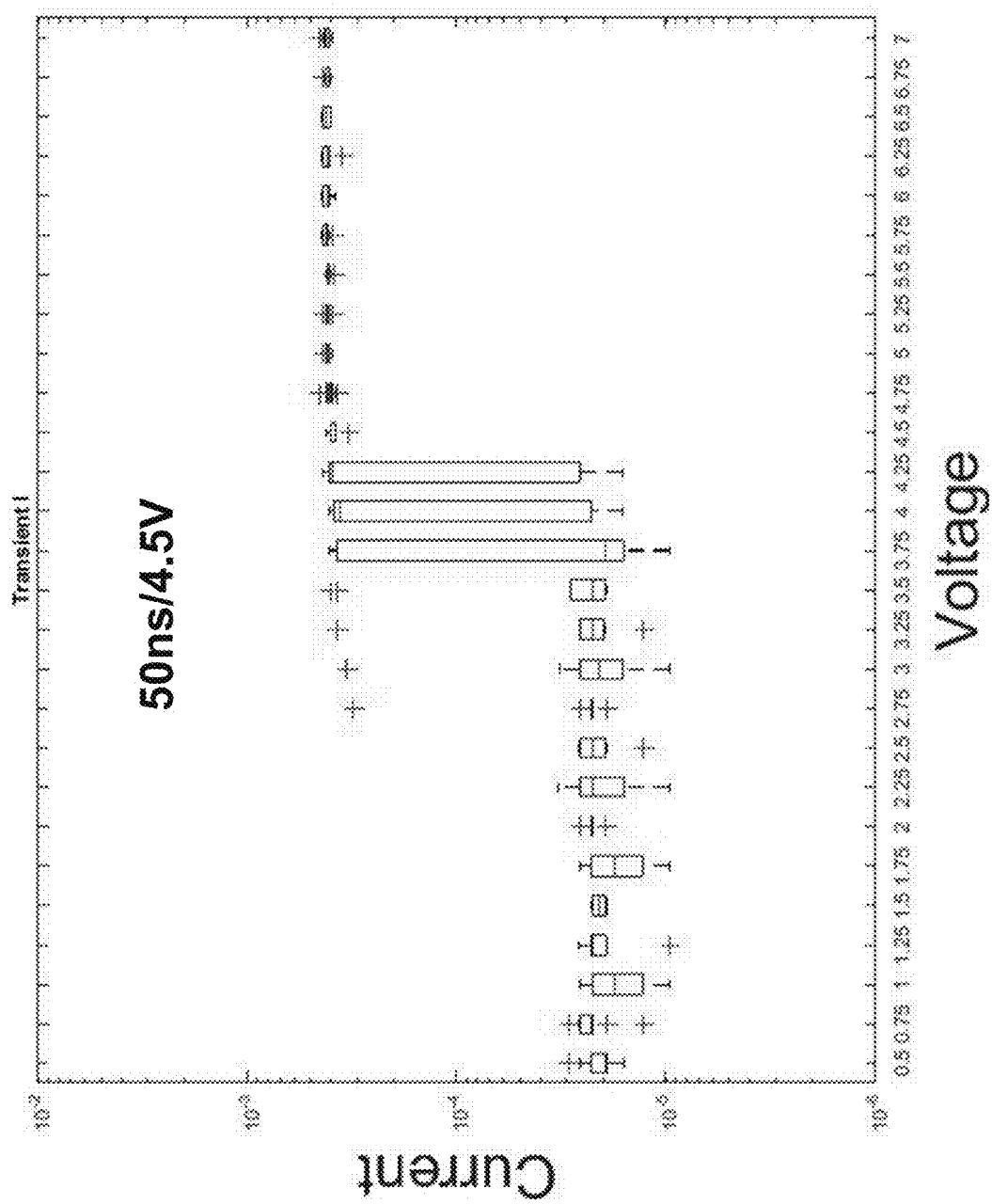
Figure 18:
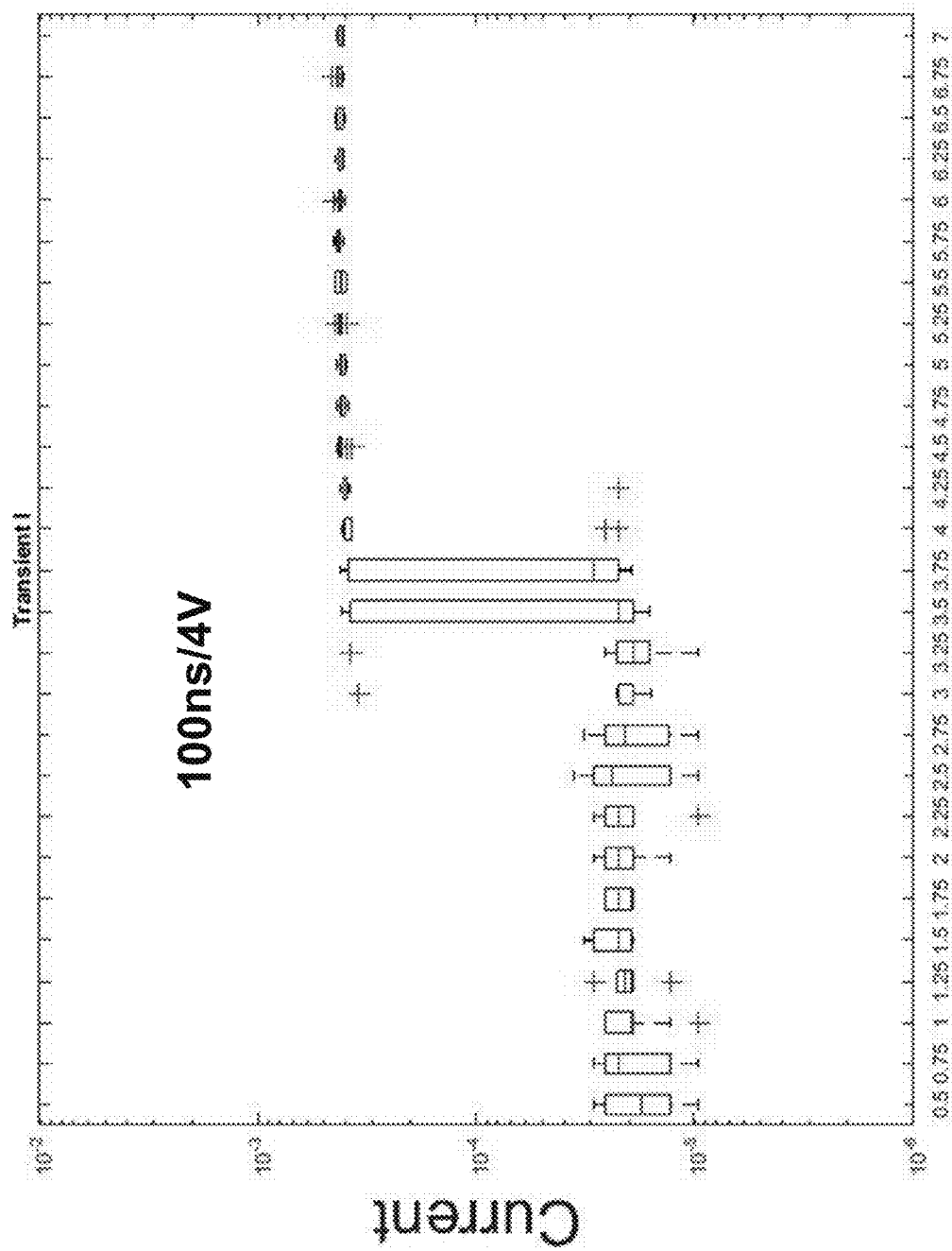
Figure 19:
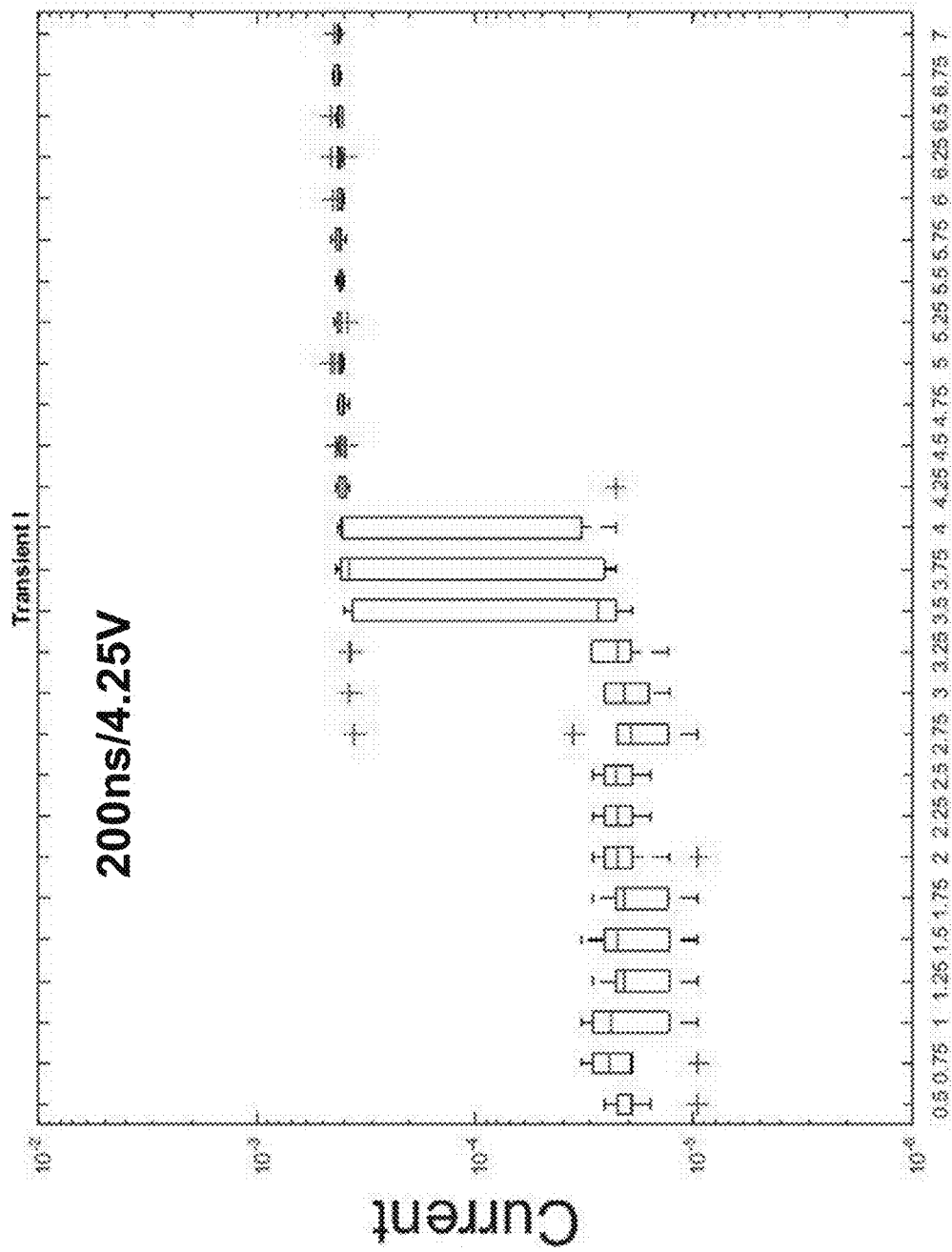
Figure 20:
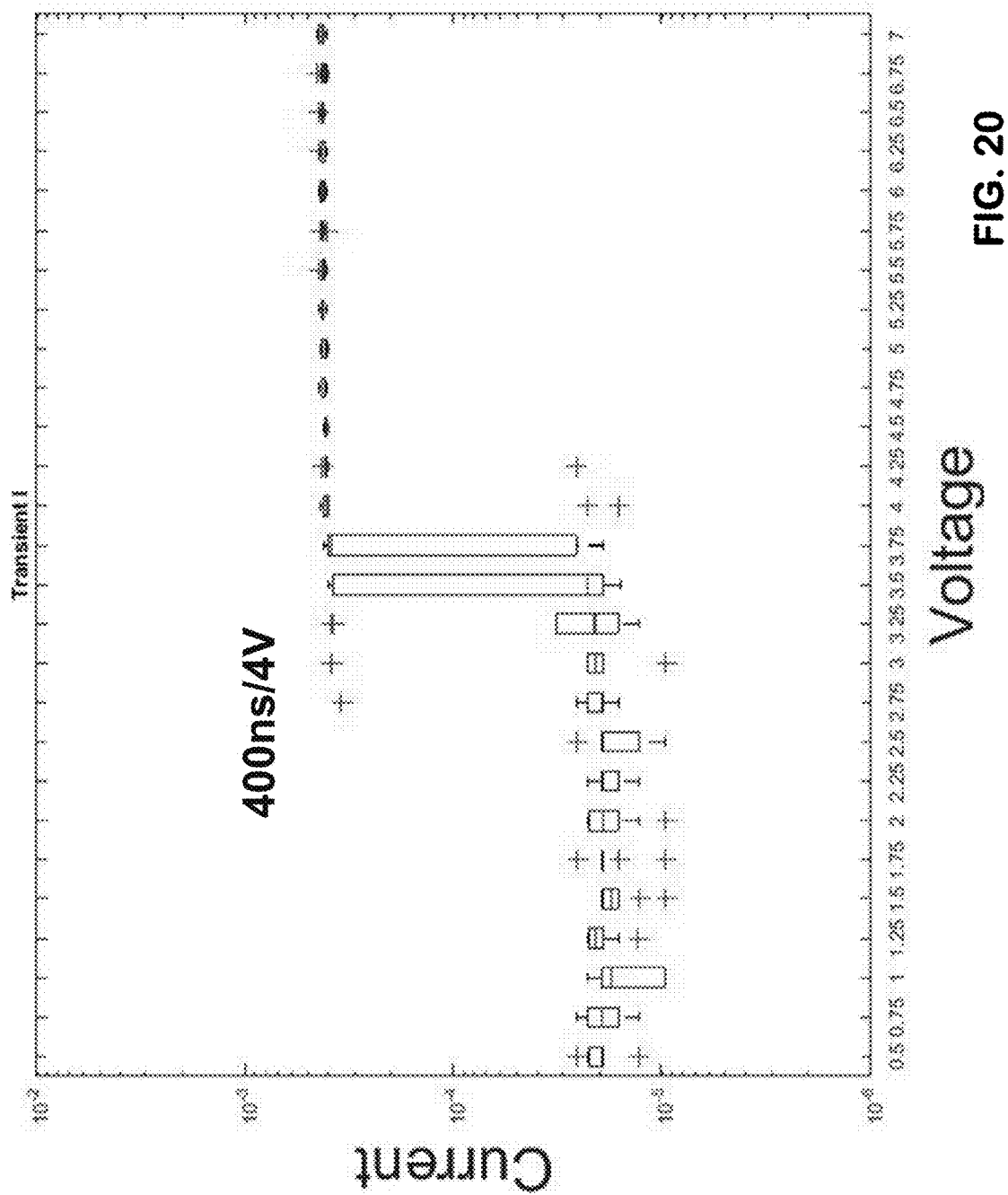

FIGS. 16-20 show the results of AC testing of a switching device using material A with a thickness of 30 nm. In FIG. 16, 10 ns pulses are applied in voltage steps ranging near 0 up to 7 V. The tests show that material A is a composition effective to switch using an applied voltage pulse 10 ns in duration at threshold voltages more than 4V and less than 4.75 V. In FIG. 17, 50 ns pulses are applied. The cells switch at more than 3.75 V and less than 4.5 V. In FIG. 18, 100 ns pulses are applied. The cells switch at more than 3.5V and less than 4 V. In FIG. 19, 200 ns pulses are applied; and the cells switch at more than 3.4 V and less than 4.25 V. In FIG. 20, 400 ns pulses are applied; and the cells switch at more than 3.3 V and less than 4 V.

Accordingly, a 30 nm thick switching layer of material A has a composition including amounts of As, Se and Ge effective to switch using applied voltage pulses, less than 50 ns in duration at a threshold voltage greater than 3 V and in some embodiments greater than 4 V. For 10 ns switching pulses, the threshold voltages exceed 4 V in most of the tested cells.

Thus, a class of chalcogenide materials is described that provides a high threshold voltage suitable for high density 3D cross-point memory technology, and other applications which require low off-state current and good endurance.

It is shown herein that the composition of Material A, and other materials in the low-Ge range 5 in the ternary composition plot in FIG. 1, include As, Se and Ge in amounts effective to switch with a threshold voltage Vt>3V, over a range of switching layer thicknesses for 15 nm to 45 nm, where a switch is effective to switch with a threshold voltage Vt>3V when control circuitry is configured for a threshold voltage satisfying the relation, by applying a voltage to a selected memory cell so that the voltage on the switch in the select memory cell is above the threshold, and a voltage to an unselected memory cell so that the voltage on the switch in unselected memory cell is below the threshold during a read operation or other operation accessing the selected memory cell.

It is shown that the composition of Material A, and other materials in the low-Ge range 5 in the ternary composition plot in FIG. 1, include As, Se and Ge in amounts effective to have off-state leakage current IOFF<1 nA, over a range of switching layer thicknesses for 15 nm to 45 nm, where a switch is effective have off-state leakage current IOFF<1 nA when control circuitry for the memory cells is configured for an IOFF in unselected memory cells during a read operation or other operation accessing a selected cell or cells satisfying the relation. It is shown that the composition of Material A, and other materials in the low-Ge range 5 in the ternary composition plot in FIG. 1, include As, Se and Ge in amounts effective to switch with a threshold voltage Vt>4V, over a range of switching layer thicknesses for 15 nm to 45, where a switch is effective to switch with a threshold voltage Vt>4V, when control circuitry is configured for a threshold voltage satisfying the relation, by applying a voltage to a selected memory cell so that the voltage on the switch in the select memory cell is above the threshold, and applying a voltage to an unselected memory cell so that the voltage on the switch in unselected memory cell is below the threshold during a read operation or other operation accessing the selected memory cell. It is shown that the composition of Material A, and other materials in the low-Ge range 5 in the ternary composition plot in FIG. 1, include As, Se and Ge in amounts effective to have off-state leakage current IOFF<500 pA, over a range of switching layer thicknesses for 15 nm to 45 nm, where a switch is effective to have off-state leakage current IOFF<500 pA, when control circuitry for the memory cells is configured for an IOFF in unselected memory cells satisfying the relation during a read operation or other operation accessing a selected cell or cells.

FIG. 21 is a simplified block diagram of an integrated circuit 700 including a 3D array 702 of cross-point memory cells having Te-free, low-Ge AsSeGe switching layers (SSL switch) as described herein, with programmable resistance memory layers. A row/level line decoder 704 having read, set and reset modes is coupled to, and in electrical communication with, a plurality of word lines 706 arranged in levels and along rows in the array 702. A column/level decoder 708 is in electrical communication with a plurality of bit lines 710 arranged in levels and along columns in the array 702 for reading, setting, and resetting the memory cells in the array 702. Addresses are supplied on bus 712 to row/level decoder 704 and column/level decoder 708. Sense circuitry (Sense amplifiers) and data-in structures in block 714, including voltage and/or current sources for the read, set, and reset modes are coupled to bit line decoder 708 via data bus 716. Data is supplied via a data-in line 718 from input/output ports on integrated circuit 700, or from other data sources internal or external to integrated circuit 700, to data-in structures in block 714. Other circuitry 720 may be included on integrated circuit 700, such as a general purpose processor or special purpose application circuitry, or a combination of modules providing system-on-a-chip functionality supported by array 702. Data is supplied via a data-out line 722 from the sense amplifiers in block 714 to input/output ports on integrated circuit 700, or to other data destinations internal or external to integrated circuit 700.

A controller 724 implemented in this example, using a bias arrangement state machine, controls the application of bias circuitry voltage sources and current sources 726 for the application of bias arrangements, including read, set, reset and verify voltages, and/or currents for the word lines and bit lines. The controller includes control circuitry configured for switching layers having a threshold voltage greater than 3V or greater than 4 V depending on the structure and composition of the switching layer, by applying a voltage to a selected memory cell so that the voltage on the switch in the select memory cell is above the threshold, and a voltage to an unselected memory cell so that the voltage on the switch in unselected memory cell is below the threshold during a read operation or other operation accessing the selected memory cell. Also, the voltage applied to unselected cells during a read of the selected memory cells is set such that the off-state current is less than 1 nA or less than 500 pA depending on the structure and composition of the switching layer during a read operation accessing the selected memory cell.

Controller 724 may be implemented using special-purpose logic circuitry as known in the art. In alternative embodiments, controller 724 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 724.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A switching device, comprising:
   a first electrode;
   a second electrode; and
   a switching layer less than 50 nm thick between the first and second electrodes, the switching layer comprising a tellurium Te-free composition of arsenic As in a range of 15 at % to 46 at %, selenium Se in a range of 27 at % to 60 at % and germanium Ge in a range of 10 at % to 25 at %, wherein the composition includes As, Se and Ge in amounts effective to switch the switching layer using an applied voltage pulse less than 50 ns in duration at a threshold voltage Vt>3V, with an off-state leakage current IOFF<1 nA.

2. The device of claim 1, wherein the composition includes As, Se and Ge in amounts effective to switch using an applied voltage pulse less than 50 ns in duration at a threshold voltage Vt>4V.

3. The device of claim 1, wherein the composition includes As, Se and Ge in amounts effective to have off-state leakage current IOFF<500 pA.

4. A switching device, comprising:
a first electrode;
a second electrode; and
a switching layer between the first and second electrodes, the switching layer comprising a composition of arsenic As in a range of 15 at % to 46 at %, selenium Se in a range of 27 at % to 60 at % and germanium Ge in a range of 20 at % to 25 at %, wherein the composition of the switching layer is tellurium Te-free and includes As, Se and Ge in amounts effective to switch the switching layer using an applied voltage pulse less than 50 ns in duration at a threshold voltage Vt>3V, with an off-state leakage current IOFF<1 nA.

5. The device of claim 4, wherein the switching layer is less than 50 nm thick.

6. The device of claim 1, wherein the switching layer has a thickness in a range of 15 to 45 nm, inclusive.

7. A memory device, comprising:
a first electrode;
a second electrode;
a memory element in contact with the first electrode;
a switching layer in series with the memory element between the first and second electrodes, the switching layer comprising a tellurium Te-free composition of arsenic As (15 at % to 46 at %), selenium Se (27 at % to 60 at %) and germanium Ge (10 at % to 25 at %); and
a barrier layer between the memory element and the switching layer, wherein the switching layer is less than 50 nm thick, and the composition includes As, Se and Ge in amounts effective to switch the switching layer using an applied voltage pulse less than 50 ns in duration at a threshold voltage Vt>3V, with an off-state leakage current IOFF<1 nA.

8. The device of claim 7, wherein the composition includes As, Se and Ge in amounts effective to switch using an applied voltage pulse less than 50 ns in duration at a threshold voltage Vt>4V.

9. The device of claim 7, wherein the composition includes As, Se and Ge in amounts effective to have off-state leakage current IOFF<500 pA.

10. The device of claim 7, wherein the switching layer has a thickness in a range of 15 to 45 nm, inclusive.

11. The device of claim 7, wherein the memory element comprises a programmable resistance material.

12. The device of claim 7, wherein the memory element comprises a phase change memory material.

* * * * *